United States Patent
Koide et al.

(10) Patent No.: US 9,523,362 B2
(45) Date of Patent: Dec. 20, 2016

(54) VEHICULAR ELECTRIC COMPRESSOR

(71) Applicant: KABUSHIKI KAISHA TOYOTA JIDOSHOKKI, Kariya-shi, Aichi-ken (JP)

(72) Inventors: Tatsuya Koide, Kariya (JP); Takuro Mizuno, Kariya (JP); Hiroshi Fukasaku, Kariya (JP)

(73) Assignee: KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 27 days.

(21) Appl. No.: 14/731,483

(22) Filed: Jun. 5, 2015

(65) Prior Publication Data
US 2015/0357844 A1    Dec. 10, 2015

(30) Foreign Application Priority Data
Jun. 6, 2014  (JP) ................ 2014-117969

(51) Int. Cl.
| | |
|---|---|
| *H02P 27/04* | (2016.01) |
| *F04C 23/00* | (2006.01) |
| *H05K 1/02* | (2006.01) |
| *F04B 35/04* | (2006.01) |
| *F04B 39/12* | (2006.01) |

(Continued)

(52) U.S. Cl.
CPC .......... *F04C 23/008* (2013.01); *F04B 35/04* (2013.01); *F04B 39/121* (2013.01); *H05K 1/0254* (2013.01); *F04B 39/00* (2013.01); *F04C 18/0215* (2013.01); *F04C 2240/808* (2013.01); *H05K 2201/10015* (2013.01)

(58) Field of Classification Search
CPC ....... F04C 23/008; F04C 29/04; F04C 29/047; F04C 21/10; F04B 39/06; F04B 39/12; F04B 35/04; F04B 39/121; F04B 49/06; H02K 5/10

USPC ............. 62/176.3, 215, 226, 228.1, 324.6, 401,62/469, 505, 508; 318/400.01, 400.02, 400.14, 318/400.15, 700, 701, 727, 794, 795, 799, 432, 318/800, 801
See application file for complete search history.

(56) References Cited

U.S. PATENT DOCUMENTS

| | | | | |
|---|---|---|---|---|
| 8,313,307 | B2 * | 11/2012 | Nakagami | F04B 39/121 417/410.1 |
| 2010/0232991 | A1 * | 9/2010 | Nakagami | F04B 39/121 417/410.5 |
| 2012/0308414 | A1 * | 12/2012 | Ogawa | F04B 39/06 417/410.5 |

FOREIGN PATENT DOCUMENTS

| | | |
|---|---|---|
| JP | 2006-196678 A | 7/2006 |
| JP | 2010-148296 A | 7/2010 |

* cited by examiner

*Primary Examiner* — Antony M Paul
(74) *Attorney, Agent, or Firm* — Sughrue Mion, PLLC

(57) ABSTRACT

There is provided a vehicular electric compressor capable of discharging electric charges of a capacitor surely and quickly in the event of an impact. The vehicular electric compressor includes: a compressing unit; an electric motor for rotating the compressing unit; and a driving circuit for driving the electric motor. The driving circuit includes: a capacitor; a circuit board provided with an electrically discharging circuit for discharging electric charges accumulated in the capacitor; and a positive electrode interconnection and a negative electrode interconnection configured to electrically connect the capacitor and the circuit board to each other. The vehicular electric compressor further includes a conductive member configured to come into contact with the positive electrode interconnection and the negative electrode interconnection, which are connected to the capacitor, when the positive electrode interconnection (Continued)

and the negative electrode interconnection are moved upon application of external force to the capacitor.

8 Claims, 6 Drawing Sheets

(51) Int. Cl.
*F04B 39/00* (2006.01)
*F04C 18/02* (2006.01)

VEHICULAR ELECTRIC COMPRESSOR

This nonprovisional application is based on Japanese Patent Application No. 2014-117969 filed on Jun. 6, 2014 with the Japan Patent Office, the entire contents of which are hereby incorporated by reference.

BACKGROUND OF THE INVENTION

Field of the Invention

The present disclosure relates to a vehicular electric compressor, in particular, a vehicular electric compressor in which a driving circuit for driving an electric motor is incorporated.

Description of the Background Art

In recent years, as a compressor provided in a vehicle such as a hybrid vehicle, an electric vehicle, a fuel cell vehicle or the like, there has been developed an electric compressor in which a driving circuit for driving an electric motor is incorporated for size reduction. In such an electric compressor, an inverter unit is attached to a housing including an electric motor and a compressor mechanism.

When a vehicle such as an automobile collides with an obstacle or the like and large force is applied to the electric compressor, a driving circuit for driving the electric motor accommodated in the inverter unit may be damaged to result in electrical leakage from a capacitor having a relatively large amount of electric charges stored therein, so that a technique of preventing the leakage of current is disclosed.

For example, Japanese Patent Laying-Open No. 2010-148296 discloses an electric compressor in which a compressor mechanism and a motor for driving the compressor mechanism are accommodated in a housing and an inverter for controlling driving of the motor is provided in a portion of the housing. Regarding the electric compressor, it has been contemplated that the inverter is constructed of at least one capacitor and other electrical components mounted on a substrate and is accommodated in an inverter case fixed to the housing and an electrically discharging member is disposed to face the capacitor with a space interposed therebetween.

However, when a vehicle collides with an obstacle or the like, there are many forms of collisions and it is difficult to predict direction and angle of an impact applied to the electric compressor. According to the technique disclosed in Japanese Patent Laying-Open No. 2010-148296, the electrically discharging member may not come into the capacitor properly depending on forms of collision, with the result that there occurs problems such that the electric charges of the capacitor are not discharged or it takes a long time until discharging of the electric charges completes, and the like.

SUMMARY OF THE INVENTION

The present disclosure has been made to solve the aforementioned problems, and one object in an aspect thereof is to provide a vehicular electric compressor capable of discharging electric charges of a capacitor surely and quickly in the event of an impact.

According to an embodiment, there is provided a vehicular electric compressor provided in a vehicle. The vehicular electric compressor includes: a compressing unit; an electric motor for rotating the compressing unit; and a driving circuit for driving the electric motor. The driving circuit includes: a capacitor; a circuit board; and a positive electrode interconnection and a negative electrode interconnection configured to electrically connect the capacitor and the circuit board to each other. The vehicular electric compressor further includes a conductive member disposed close to the positive electrode interconnection and the negative electrode interconnection. The vehicular electric compressor is configured such that the positive electrode interconnection and the negative electrode interconnection, which are connected to the capacitor, are electrically connected to each other via the conductive member when the positive electrode interconnection and the negative electrode interconnection are moved based on external force applied in the event of a collision of the vehicle.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
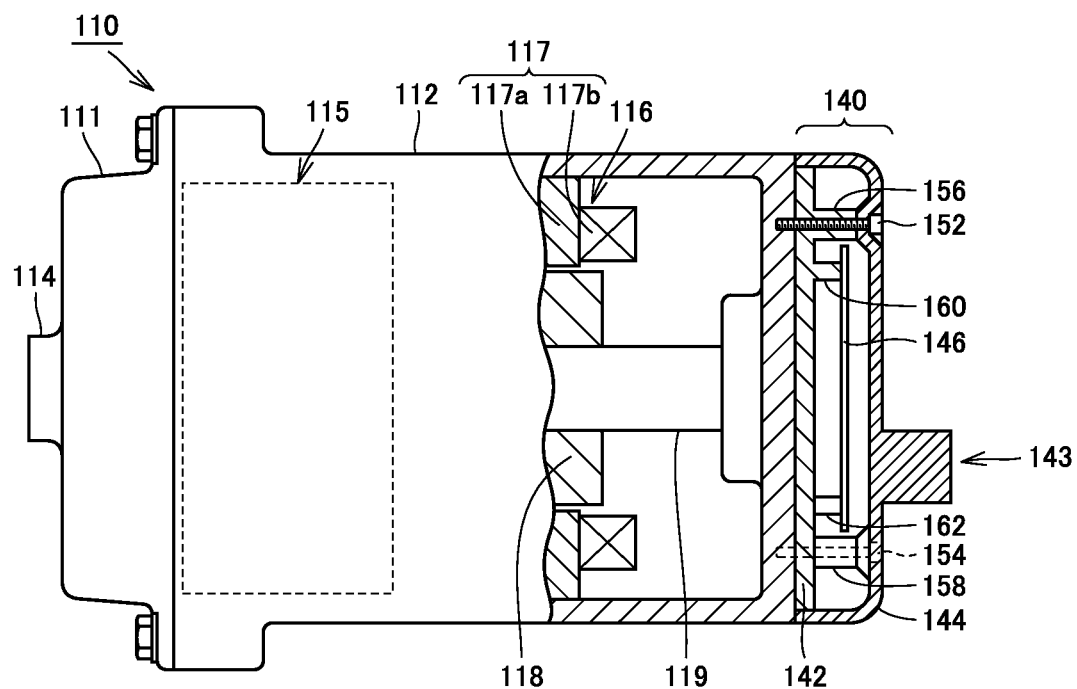
FIG. 1 is a schematic diagram showing an entire configuration of an electric compressor according to a first embodiment.

The following describes the present embodiment in detail with reference to figures. It should be noted that the same or corresponding portions in the figures are given the same reference characters and are not described repeatedly.

First Embodiment

Entire Configuration

FIG. 1 is a schematic diagram showing an entire configuration of an electric compressor according to a first embodiment. It should be noted that an electric compressor 110 is a vehicular electric compressor provided in a vehicle in the present embodiment.

Referring to FIG. 1, the electric compressor 110 includes: a housing formed by joining a discharge housing 111, which has a cover-like shape and is made of aluminum (metal material), to a suction housing 112, which has a shape of cylinder with a bottom and is made of aluminum (metal material); a compressing unit 115 and an electric motor 116, which are accommodated in the suction housing 112; and an inverter unit 140 attached to the suction housing 112 such that the inverter unit 140 is incorporated with the suction housing 112. An outline of the electric compressor 110 is formed by the housing and an inverter cover 144, which is made of aluminum (metal material), of the inverter unit 140.

A suction port (not shown) is formed at the bottom portion side of the circumferential wall of the suction housing 112. An external refrigerant circuit (not shown) is connected to the suction port. A discharge port 114 is formed at the cover side of the discharge housing 111. The discharge port 114 is connected to the external refrigerant circuit. Accommodated in the suction housing 112 are: the compressing unit 115 for compressing a refrigerant; and the electric motor 116 for driving the compressing unit 115. Although not shown in the figure, for example, the compressing unit 115 includes a fixed scroll fixed in the suction housing 112 and a movable scroll disposed to face the fixed scroll.

A stator 117 is fixed on the inner circumferential surface of the suction housing 112. The stator 117 includes: a stator core 117a fixed to the inner circumferential surface of the suction housing 112; and coils 117b wound around teeth (not shown) of the stator core 117a.

In the suction housing 112, a rotating shaft 119, which is inserted in the stator 117, is rotatably supported. A rotor 118 is fixed to the rotating shaft 119.

The inverter unit 140 is provided on the suction housing 112 at its external surface opposite to the discharge housing 111. The inverter unit 140 includes a metal base 142, which is made of aluminum (metal material), a circuit board 146, and the inverter cover 144.

The inverter cover 144 covers the circuit board 146 to protect it from contamination, humidity, and the like. The inverter cover 144 is fixed to the suction housing 112 by screws 152, 154 at both sides with legs 156, 158 interposed therebetween. The legs 156, 158 are formed on the metal base 142. In the inverter cover 144, a power supply input port 143 having a cylindrical shape is formed to be supplied with a DC power supply voltage from outside.

The circuit board 146 is accommodated in an accommodation space between the inverter cover 144 and the metal base 142 such that the mounting surface of the circuit board 146 is orthogonal to the axial direction of the rotating shaft 119. In the present embodiment, the compressing unit 115, the electric motor 116, and the inverter unit 140 are arranged side by side in this order in the axial direction of the rotating shaft 119.

The metal base 142 is fastened to the suction housing 112 using the screws 152, 154. The metal base 142 and the suction housing 112 are each made of metal having good heat conductivity and are in close contact with each other. Hence, the metal base 142 serves to dissipate heat from the inverter unit 140 by conducting the heat in the inverter unit 140 to the suction housing 112.

Figure 2:
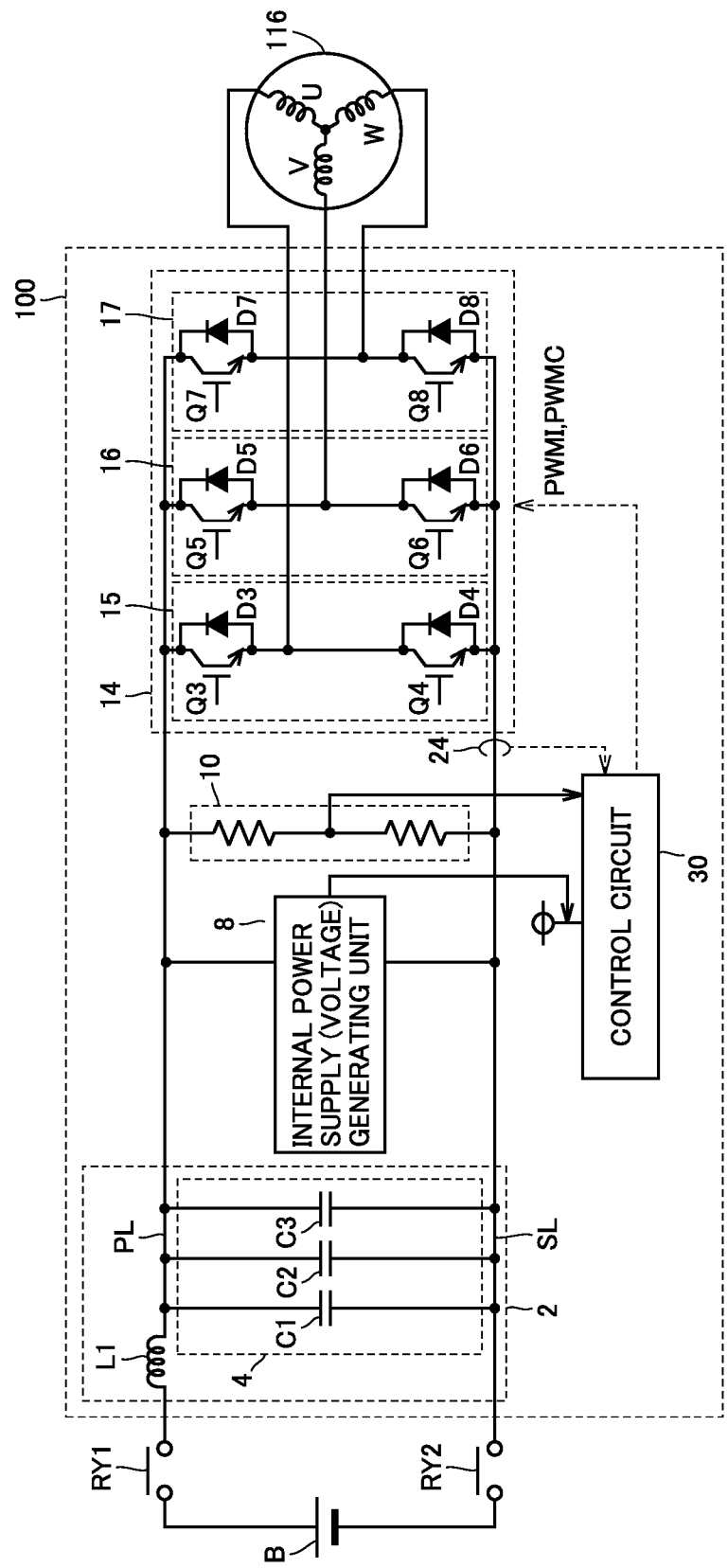
FIG. 2 is a circuit diagram of a driving circuit that drives a motor for an electric compressor.

The circuit board 146 is fixed by screws (not shown) to legs 160, 162 formed on the metal base 142, with a space between the circuit board 146 and the metal base 142. The metal base 142 functions as a base member which is made of metal and supports the circuit board 146. In the space between the circuit board 146 and the metal base 142, a driving control circuit (inverter circuit) for the electric motor 116 as well as an electromagnetic coil L1 and a capacitor circuit 4, which form a below-described filter circuit shown in FIG. 2, are accommodated. The driving control circuit is mounted on the circuit board 146.

The electric power controlled by the inverter unit 140 is supplied to the electric motor 116, thereby rotating the rotor 118 and the rotating shaft 119 at a controlled rotational speed. By this rotation, the compressing unit 115 is driven. By driving the compressing unit 115, the refrigerant is suctioned from the external refrigerant circuit into the suction housing 112 via the suction port, the refrigerant thus suctioned into the suction housing 112 is compressed by the compressing unit 115, and the compressed refrigerant is discharged to the external refrigerant circuit via the discharge port 114.

<Circuit Configuration>

FIG. 2 is a circuit diagram of a driving circuit that drives the motor for the electric compressor.

Referring to FIG. 2, the driving circuit 100 includes: a low-pass filter circuit 2 which has the electromagnetic coil L1 and the capacitor circuit 4; an internal power supply voltage generating unit 8; a resistance circuit 10; an inverter circuit 14; and a control circuit 30.

The inverter circuit 14 includes a U phase arm 15, a V phase arm 16, and a W phase arm 17, each of which is connected between a positive electrode bus PL and a negative electrode bus SL.

The U phase arm 15 includes: transistors Q3, Q4 connected in series between the positive electrode bus PL and the negative electrode bus SL; and diodes D3, D4 respectively connected in anti-parallel with the transistors Q3, Q4. A connection node of the transistors Q3, Q4 is connected to one end of the U phase coil of the stator of the electric motor 116.

The V phase arm 16 includes: transistors Q5, Q6 connected in series between the positive electrode bus PL and the negative electrode bus SL; and diodes D5, D6 respectively connected in anti-parallel with the transistors Q5, Q6. A connection node of the transistors Q5, Q6 is connected to one end of the V phase coil of the stator of the electric motor 116.

The W phase arm 17 includes: transistors Q7, Q8 connected in series between the positive electrode bus PL and the negative electrode bus SL; and diodes D7, D8 respectively connected in anti-parallel with the transistors Q7, Q8. A connection node of the transistors Q7, Q8 is connected to one end of the W phase coil of the stator of the electric motor 116.

The other end of each of the U phase coil, the V phase coil, and the W phase coil of the stator of the electric motor 116 is connected to a neutral point.

Examples of the transistors Q3 to Q8 used herein include semiconductor transistors such as insulated gate bipolar transistors and electric field effect transistors.

By controlling switching of the transistors Q3 to Q8, a three-phase alternating current is output from the inverter circuit 14 to the stator coils of the electric motor 116.

The inverter circuit 14 is supplied with a DC voltage from a DC power supply B via relays RY1, RY2 and the low-pass filter circuit 2.

The electromagnetic coil L1 and the capacitor circuit 4 are included in the low-pass filter circuit 2. The low-pass filter circuit 2 suppresses passage of high-frequency component of the voltage from the DC power supply B to the inverter circuit 14, and suppresses passage of high-frequency component of the voltage from the inverter circuit 14 to the DC power supply B side. The high-frequency component of the voltage refers to a voltage component having a frequency equal to or higher than a predetermined value. The predetermined value is a cutoff frequency determined from the electromagnetic coil L1 and the capacitor circuit 4.

The electromagnetic coil L1 is connected between the positive electrode of the DC power supply B and the positive electrode bus PL. The capacitor circuit 4 is connected between the positive electrode bus PL and the negative electrode bus SL.

The capacitor circuit 4 includes capacitors C1 to C3 (hereinafter collectively referred to as "capacitor C") connected in parallel between the positive electrode bus PL and the negative electrode bus SL. In the present embodiment, the capacitor circuit 4 is configured to have three capacitors C. The embodiment, however, is not limited to this configuration. The capacitor circuit 4 may be configured to have one capacitor C or two capacitors C and may be configured to have four or more capacitors C. For example, the capacitor C is a film capacitor but may be an electrolytic capacitor.

The internal power supply voltage generating unit 8 generates an internal power supply voltage used in the control circuit 30. The resistance circuit 10 divides the voltage using resistance elements connected in series between the positive electrode bus PL and the negative electrode bus SL so as to decrease it to a voltage that can be monitored by the control circuit 30, and outputs the divided voltage to the control circuit 30.

A current sensor 24 detects a current flowing in the negative electrode bus SL. The current flowing in the negative electrode bus SL is obtained by superimposing a W phase current, a V phase current, and a U phase current. The W phase current is a current flowing in the W phase coil. The V phase current is a current flowing in the V phase coil. The U phase current is a current flowing in the U phase coil.

The control circuit 30 includes a CPU (Central Processing Unit) and the like and executes a computer program that controls driving of the electric motor 116.

It should be noted that the DC power supply B in the present embodiment may supply electric power to a three-phase motor for traveling in addition to the electric motor 116. The three-phase motor for traveling performs a power running operation for driving wheels of a hybrid vehicle or an electric vehicle, and a regenerative operation for generating electric power using rotational force of the driving wheels.

<Discharging of Electric Charges Accumulated in Capacitor>

The following describes discharging of electric charges accumulated in the capacitors C1 to C3 in the event of a collision of the vehicle including the electric compressor 110 with an obstacle or the like. Described in the present embodiment is an example in which the capacitors C1 to C3 and a conductive member are disposed on metal base 142.

In the event of a collision of the vehicle, external force is exerted to the capacitor C to cause movement, deformation, or the like of the capacitor C and a positive electrode interconnection and a negative electrode interconnection for connecting the capacitor C to the circuit board 146 are brought into contact with the conductive member due to this external force exerted. Accordingly, the positive electrode interconnection and the negative electrode interconnection are short-circuited, thereby discharging the electric charges accumulated in the capacitor C. This will be specifically described with reference to FIG. 3 to FIG. 5.

Figure 3:
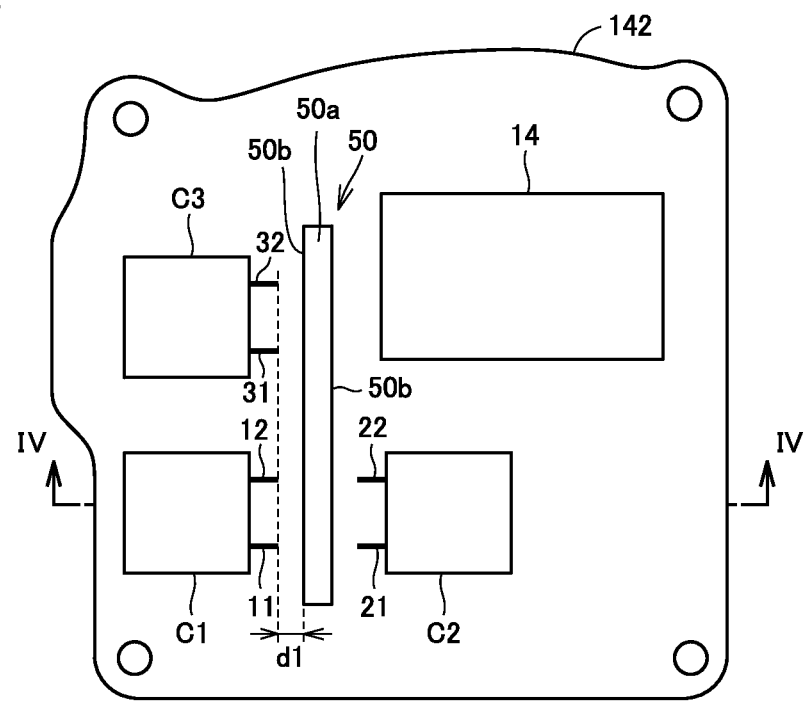
FIG. 3 is a schematic plan view of a metal base in the electric compressor according to the first embodiment.
Figure 4:
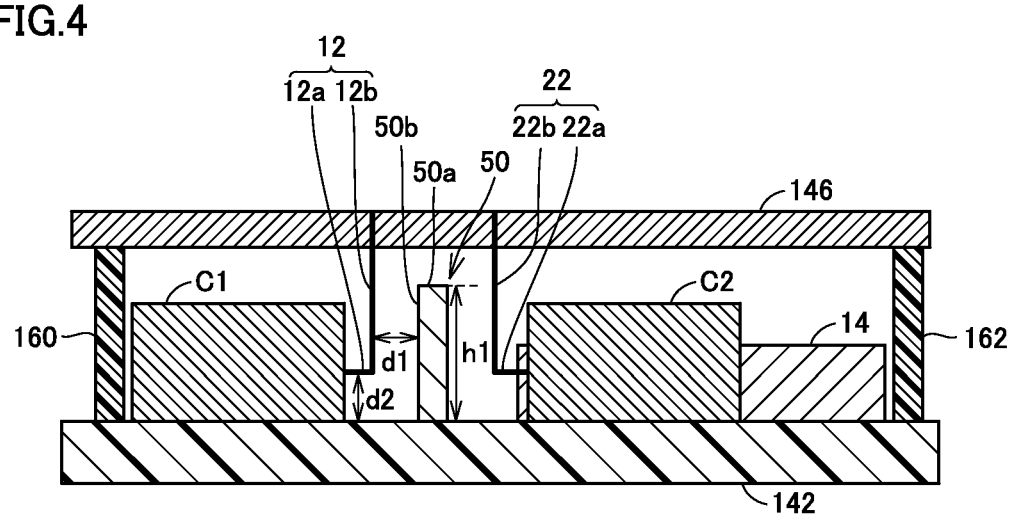
FIG. 4 is a schematic cross sectional view along a IV-IV line shown in FIG. 3.
Figure 5:
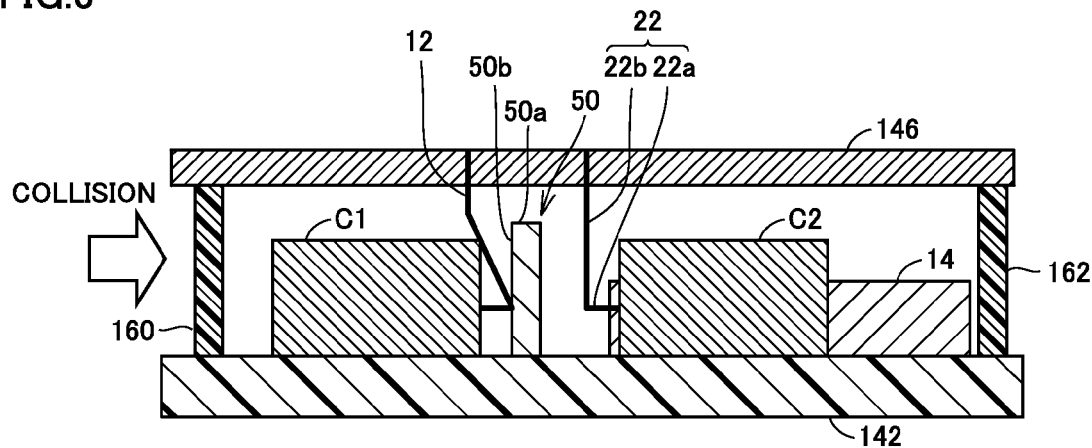
FIG. 5 shows that the positive electrode interconnection and the negative electrode interconnection are brought into contact with the conductive member due to external force exerted.

FIG. 3 is a schematic plan view of the metal base 142 in the electric compressor according to the first embodiment. It should be noted that for ease of description, the below-described circuit board 146 in FIG. 4 is omitted in FIG. 3. FIG. 4 is a schematic cross sectional view along a IV-IV line shown in FIG. 3. FIG. 5 shows that the positive electrode interconnection and the negative electrode interconnection are brought into contact with the conductive member due to the exerted external force.

Referring to FIG. 3 and FIG. 4, the metal base 142 is provided with capacitors C1 to C3, the conductive member 50, and the inverter circuit 14. The positive electrode interconnection 11 and the negative electrode interconnection 12 electrically connect the capacitor C1 and the circuit board 146 to each other, the positive electrode interconnection 21 and the negative electrode interconnection 22 electrically connect the capacitor C2 and the circuit board 146 to each other, and the positive electrode interconnection 31 and the negative electrode interconnection 32 electrically connect the capacitor C3 and the circuit board 146 to each other.

Each of the positive electrode interconnections 11, 21, 31 is connected thereto on the circuit board 146, and each of the negative electrode interconnections 12, 22, 32 is also connected thereto on the circuit board 146. Specifically, as shown in FIG. 2, the capacitors C1 to C3 are connected to one another in parallel via the positive electrode interconnection and the negative electrode interconnection, which are connected to the capacitors, and the circuit board 146.

Each of the positive electrode interconnections 11, 21, 31 and the negative electrode interconnections 12, 22, 32 includes: a portion (perpendicular interconnection portion) perpendicular to the conductive side surface 50b of the conductive member 50; and a portion (parallel interconnection portion) parallel to the conductive side surface 50b. For example, referring to FIG. 4, assuming negative electrode interconnections 12, 22, the negative electrode interconnection 12 has a perpendicular interconnection portion 12a and a parallel interconnection portion 12b, and the negative electrode interconnection 22 has a perpendicular interconnection portion 22a and a parallel interconnection portion 22b.

The conductive member 50 is provided (fixed) on the metal base 142 to project toward the circuit board 146. Typically, the conductive member 50 is formed integrally with the metal base 142 and is made of the same material as the metal base 142. It should be noted that the conductive member 50 may be made of a material different from the metal base 142.

The conductive member 50 has a shape projecting from the metal base 142 by a height h1. The height h1 is preferably more than a distance (specifically, a distance d2 in FIG. 4) from the metal base 142 to a position at which each of the positive electrode interconnection and the negative electrode interconnection is connected to the capacitor C. Accordingly, in the event of a collision with the vehicle, the conductive member 50 can be more likely to come into contact with the positive electrode interconnection and the negative electrode interconnection.

The conductive member 50 has a conductive facing surface 50a facing the circuit board 146, and a conductive side surface 50b extending from the conductive facing surface 50a to the metal base 142. The conductive member 50 is provided such that this conductive side surface 50b faces the positive electrode interconnections 11, 21, 31 and the negative electrode interconnections 12, 22, 32.

Here, under a normal condition, the conductive member 50 is insulated from the positive electrode interconnections 11, 21, 31 and the negative electrode interconnections 12, 22, 32, whereas in the event of a collision, the conductive member 50 needs to come into contact with these interconnections. Therefore, the conductive member 50 is disposed near (disposed close to) the positive electrode interconnections 11, 21, 31 and the negative electrode interconnections 12, 22, 32.

For example, referring to FIG. 4, assuming the negative electrode interconnection 12, the conductive member 50 is fixed on the metal base 142 at a position at which the conductive side surface 50b is separated from the parallel interconnection portion 12b of the negative electrode interconnection 12 by a distance d1. It should be noted that, typically, the conductive member 50 is fixed on the metal base 142 at a position at which the conductive member 50 is separated, by the distance d1, from each of the parallel interconnection portions of the positive electrode interconnections 11, 21, 31 and the negative electrode interconnections 22, 32.

This distance d1 is such that insulation is secured between each of the positive electrode interconnections 11, 21, 31 and the negative electrode interconnections 12, 22, 32 and the conductive member 50 under a normal condition and such that the positive electrode interconnections 11, 21, 31 and the negative electrode interconnections 12, 22, 32 are brought into contact with the conductive member 50 in the event of impact without the positive electrode interconnections 11, 21, 31 and the negative electrode interconnections 12, 22, 32 being broken. For example, the distance d1 is 2 to 3 mm.

Here, when a vehicle provided with the electric compressor 110 according to the present embodiment collides with an obstacle or the like, a collision load (external force) is generated on the inverter unit 140 (more specifically, the capacitor C) in a direction of arrow shown in FIG. 5. For example, the direction of arrow indicates a direction of collision load when it is generated from the front of the vehicle. When such external force is applied to the capacitor C1, the capacitor C1 is deformed or moved rightward in the figure due to the external force, with the result that the positive electrode interconnection 11 and the negative electrode interconnection 12 connected to the capacitor C1 are moved rightward. Accordingly, the positive electrode interconnection 11 and the negative electrode interconnection 12 are brought into contact with the conductive member 50.

Specifically, as in the example of FIG. 5, the electric compressor 110 is configured such that the positive electrode interconnection 11 and the negative electrode interconnection 12, which are connected to the capacitor C1, are electrically connected to each other via the conductive member 50 when the positive electrode interconnection 11 and the negative electrode interconnection 12 are moved based on the external force applied in the event of a collision of the vehicle.

Moreover, referring to FIG. 3, the conductive member 50 is disposed near the positive electrode interconnections 11, 21, 31 and the negative electrode interconnections 12, 22, 32. Therefore, for example, even if the collision load is generated on the capacitors C1, C3 in the upper left direction or lower left direction in FIG. 3 in the event of a collision, the positive electrode interconnections 11, 31 and the negative electrode interconnections 12, 32 are brought into contact with the conductive member 50 without the positive electrode interconnections 11, 31 and the negative electrode interconnections 12, 32 being broken.

The positive electrode interconnection 11 receives high positive voltage and the negative electrode interconnection 12 receives high negative voltage, so that the positive electrode interconnection 11 and the negative electrode interconnection 12 are short-circuited when they are brought into contact with the conductive member 50. In this way, electric charges accumulated in the capacitor C1 are discharged. It should be noted that because the capacitors C1 to C3 are connected to one another in parallel as described above, electric charges accumulated in the capacitors C2, C3 are also discharged when the positive electrode interconnection 11 and the negative electrode interconnection 12 are brought into contact with the conductive member 50.

Typically, the electric charges accumulated in the capacitors C1 to C3 are spontaneously discharged by an electrically discharging circuit mounted on the circuit board 146. Specifically, as the electrically discharging circuit, the circuit board 146 is provided with the internal power supply voltage generating unit 8 and the resistance circuit 10. It should be noted that the electrically discharging circuit is not limited to these and may include a discharging resistance for consuming electric charges, or the like.

In the description above, it has been illustrated that the distance between the conductive member 50 and each of the positive electrode interconnections 11, 21, 31 and the negative electrode interconnections 12, 22, 32 is set at the distance d1; however, the present disclosure is not limited to this and the distance between the conductive member 50 and each of the positive electrode interconnections and the negative electrode interconnections may be set only in consideration of the direction in which the collision load is highly likely to be generated (the left-to-right direction in FIG. 3, for example). For example, the distance between the conductive member 50 and each of the positive electrode interconnections 11, 31 and the negative electrode interconnections 12, 32 may be set at the distance d1, whereas the distance between the conductive member 50 and each of the positive electrode interconnection 21 and the negative electrode interconnection 22 may be set to be not less than the distance d1.

According to the first embodiment, in the event of impact, the positive electrode interconnection and the negative electrode interconnection are brought into contact with the conductive member 50 without the positive electrode interconnection and the negative electrode interconnection being broken, whereby the electric charges accumulated in the capacitor C can be discharged securely and quickly.

Second Embodiment

In the first embodiment, it has been illustrated that the conductive member 50 is provided on the metal base 142. In a second embodiment, the following describes a configuration in which the conductive member is provided on the metal base 142 with an insulating member interposed therebetween. It should be noted that the detailed description is not repeated with regard to the same configuration as that of the first embodiment.

Figure 6:
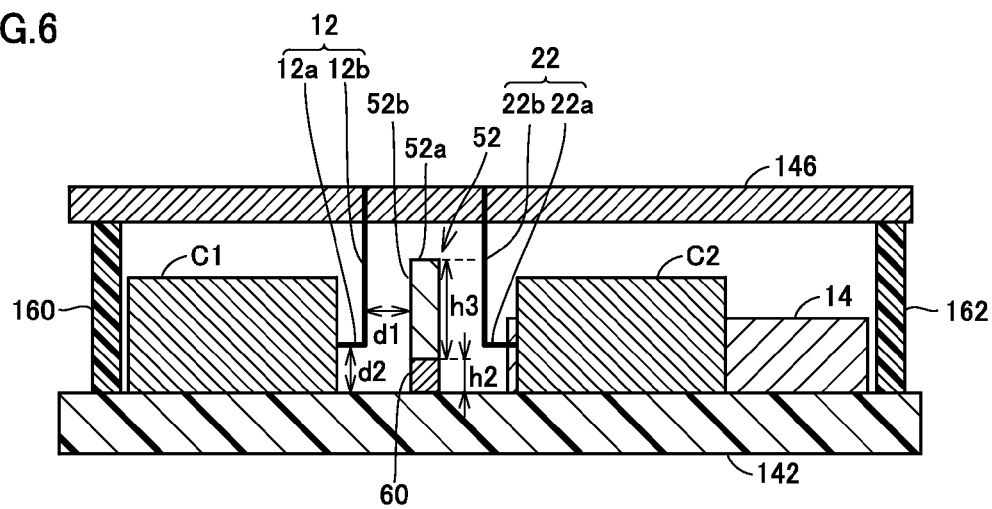
FIG. 6 illustrates a configuration of an electric compressor according to a second embodiment.

FIG. 6 illustrates a configuration of an electric compressor according to the second embodiment. The configuration shown in FIG. 6 corresponds to a configuration in which the conductive member 50 in FIG. 4 is changed to a conductive member 52 and an insulating member 60.

Referring to FIG. 6, the conductive member 52 includes: a conductive facing surface 52a facing the circuit board 146; and a conductive side surface 52b extending from the conductive facing surface 52a to the metal base 142. The conductive member 52 is provided on the metal base 142 with the insulating member 60 interposed therebetween, and has a shape projecting toward the circuit board 146.

Specifically, the insulating member 60 has a shape projecting from the metal base 142 toward the circuit board 146 by a height h2. The conductive member 52 has a shape projecting from the insulating member 60 toward the circuit board 146 by a height h3. It should be noted that the height h2 of the insulating member 60 is preferably less than a distance to a position at which each of the positive electrode interconnection and the negative electrode interconnection is connected to the capacitor C (specifically, a distance d2 in FIG. 6). Accordingly, in the event of a collision of the vehicle, the conductive member 52 can be more likely to be brought into contact with the positive electrode interconnection and the negative electrode interconnection.

According to the second embodiment, insulation between the conductive member 52 and the metal base 142 is secured. Accordingly, for example, even if current flows into the driving circuit side via the metal base 142 in the event of a collision of the vehicle, the conductive member 52 is not affected by the current, thus eliminating a factor inhibiting the discharging of the capacitor C.

Third Embodiment

In the above-described first embodiment, it has been illustrated that the conductive member 50 is provided near each of the positive electrode interconnections 11, 21, 31 and the negative electrode interconnections 12, 22, 32. In the third embodiment, the following describes a configuration in which the conductive member is provided near the positive electrode interconnection and the negative electrode interconnection each connected to at least one of the plurality of capacitors C. It should be noted that the detailed description is not repeated with regard to the same configuration as that of the first embodiment.

Figure 7:
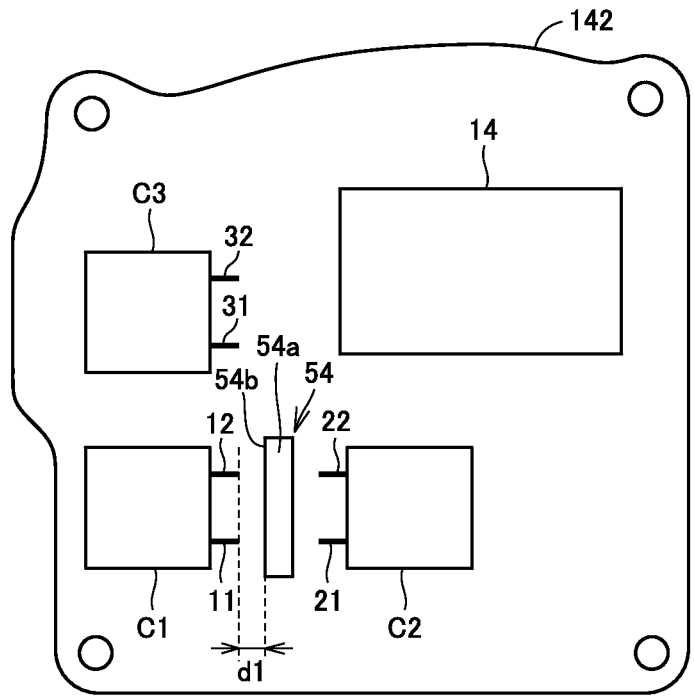
FIG. 7 illustrates a configuration of an electric compressor according to a third embodiment.

FIG. 7 illustrates a configuration of an electric compressor according to the third embodiment. The configuration shown in FIG. 7 corresponds to a configuration in which the conductive member 50 in FIG. 3 is changed to a conductive member 54. Referring to FIG. 7, the conductive member 54 includes: a conductive facing surface 54a facing the circuit board 146; and a conductive side surface 54b extending from the conductive facing surface 54a to the metal base 142. The conductive member 54 is provided only near the positive electrode interconnections 11, 21 and the negative electrode interconnections 12, 22, and is not provided near the positive electrode interconnection 31 and the negative electrode interconnection 32 connected to the capacitor C3.

Here, as described above, the capacitors C1 to C3 are connected to one another in parallel via the positive electrode interconnections, the negative electrode interconnections, and the circuit board 146. Hence, if a positive electrode interconnection and a negative electrode interconnection connected to at least one of the capacitors C1 to C3 are configured to come into contact with the conductive member 54 when the positive electrode interconnection and the negative electrode interconnection are moved due to external force exerted on the capacitors C1 to C3 in the event of a collision of the vehicle, the electric charges in all the capacitors C1 to C3 are discharged due to the contact. Accordingly, for example, the conductive member 54 may be provided only in the vicinity of the positive electrode interconnection and the negative electrode interconnection connected to the capacitor C to which external force is most likely to be applied in the event of a collision of the vehicle.

According to the third embodiment, an area occupied by the conductive member on the metal base can be reduced as compared with that in the first embodiment. Therefore, the resulting surplus in area can be utilized as a space for other elements, thereby improving a degree of freedom in design.

Fourth Embodiment

In the first embodiment, it has been illustrated that the bar-like conductive member is provided near the positive electrode interconnection and the negative electrode interconnection. In the fourth embodiment, it will be illustrated that a conductive member is provided to surround at least a part of the circumference of each of the positive electrode interconnection and the negative electrode interconnection. It should be noted that the detailed description is not repeated with regard to the same configuration as that of the first embodiment.

Figure 8:
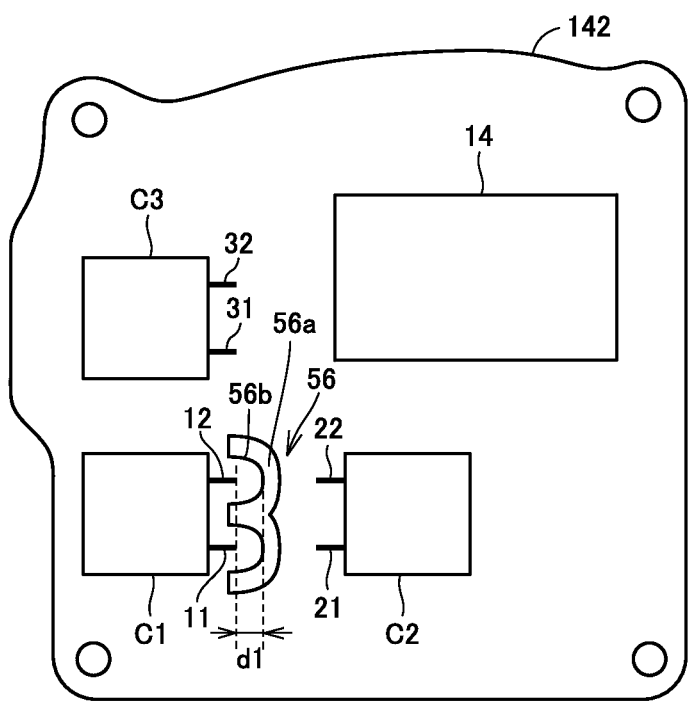
FIG. 8 illustrates a configuration of an electric compressor according to a fourth embodiment.

FIG. 8 illustrates a configuration of an electric compressor according to the fourth embodiment. The configuration shown in FIG. 8 corresponds to a configuration in which the conductive member 50 in FIG. 3 is changed to a conductive member 56. Referring to FIG. 8, the conductive member 56 is provided near the positive electrode interconnection 11 and the negative electrode interconnection 12 so as to surround a part of the circumference of each of the positive electrode interconnection 11 and the negative electrode interconnection 12.

Specifically, the conductive member 56 includes: a conductive facing surface 56a facing the circuit board 146; and a conductive side surface 56b extending from the conductive facing surface 56a to the metal base 142. The conductive side surface 56b of the conductive member 56 is located at a position away from the positive electrode interconnection 11 and the negative electrode interconnection 12 by the distance d1, and the conductive member 56 is fixed on the metal base 142 to surround a part of the circumference of the positive electrode interconnection 11 and the negative electrode interconnection 12. As shown in FIG. 8, for example, the conductive side surface 56b has a shape of M.

It should be noted that the conductive member 56 may be provided to surround a part of the circumference of each of the positive electrode interconnection 21 and the negative electrode interconnection 22 and a part of the circumference of each of the positive electrode interconnection 31 and the negative electrode interconnection 32.

According to the fourth embodiment, even if collision load is applied in the upward/downward direction in FIG. 8 in the event of a collision of the vehicle, the conductive member 56 is likely to come into contact with the positive electrode interconnection and the negative electrode interconnection, thereby discharging securely electric charges accumulated in the capacitor C.

Fifth Embodiment

In the first embodiment, it has been illustrated that the conductive member 50 is provided on the metal base 142. In the fifth embodiment, it has been illustrated that a conductive member is provided on the circuit board 146. It should be noted that the detailed description is not repeated with regard to the same configuration as that of the first embodiment.

Figure 9:
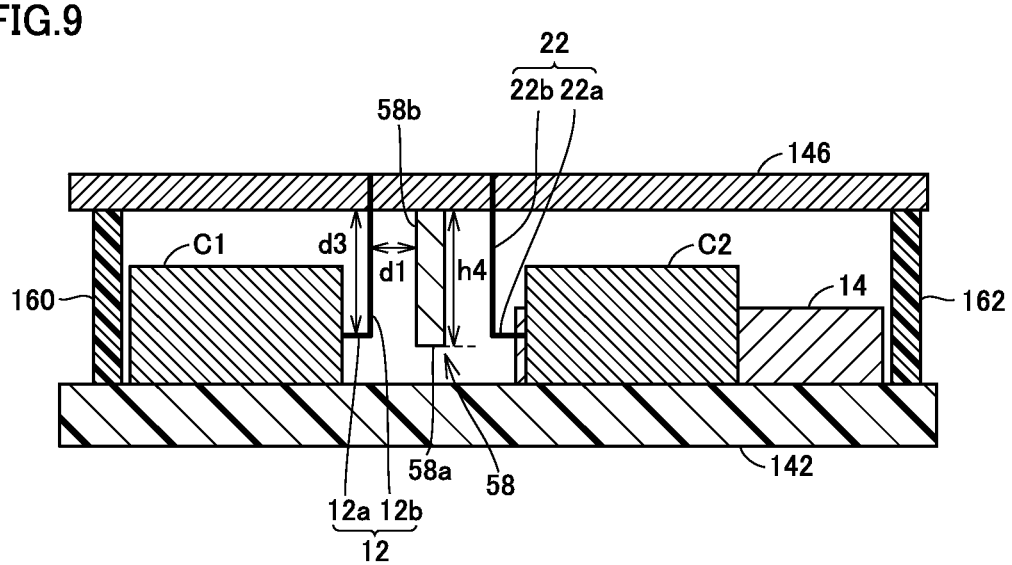
FIG. 9 illustrates a configuration of an electric compressor according to a fifth embodiment.

FIG. 9 illustrates a configuration of an electric compressor according to the fifth embodiment. The configuration shown in FIG. 9 corresponds to a configuration in which the conductive member 50 provided on the metal base 142 in FIG. 4 is changed to a conductive member 58 provided on the circuit board 146.

Referring to FIG. 9, the conductive member 58 includes: a conductive facing surface 58a facing a metal base 142; and a conductive side surface 58b extending from the conductive facing surface 58a to the circuit board 146. The conductive member 58 is soldered to the circuit board 146, and has a shape projecting, by a height h4, from the circuit board 146 toward the metal base 142.

The height h4 of the conductive member 58 is preferably more than a distance from the circuit board 146 to a connection position of each of the positive electrode interconnection and the negative electrode interconnection to the capacitor C (specifically, a distance d3 in FIG. 9). Accordingly, in the event of a collision of the vehicle, the conductive member 58 can be more likely to come into contact with the positive electrode interconnection and the negative electrode interconnection.

According to the fifth embodiment, even if it is impossible to secure a space for a conductive member on a metal base, the conductive member thus provided on the circuit board securely allows for discharging of electric charges accumulated in the capacitor C.

Other Embodiment

The configurations illustrated as the above-described embodiments are examples of the configuration of the present disclosure, and can be combined with other known techniques and can be changed as long as they are not deviated from the essential part of the present disclosure; for example, a part of the configurations may be omitted.

Moreover, an embodiment may be implemented appropriately in combination with a configuration illustrated in a different embodiment.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A vehicular electric compressor provided in a vehicle comprising:
    a compressing unit;
    an electric motor for rotating the compressing unit; and
    a driving circuit for driving the electric motor,
    the driving circuit including:
        a capacitor;
        a circuit board; and
        a positive electrode interconnection and a negative electrode interconnection configured to electrically connect the capacitor and the circuit board to each other,
    the vehicular electric compressor further comprising a conductive member disposed close to the positive electrode interconnection and the negative electrode interconnection,
    the positive electrode interconnection and the negative electrode interconnection, which are connected to the capacitor, being configured to be electrically connected to each other via the conductive member when the positive electrode interconnection and the negative electrode interconnection are moved based on external force applied in the event of a collision of the vehicle.

2. The vehicular electric compressor according to claim 1, further comprising a metal base configured to support the circuit board,
    wherein the conductive member is provided on the metal base so as to project toward the circuit board.

3. The vehicular electric compressor according to claim 2, wherein
    the conductive member includes a conductive facing surface to face the circuit board and a conductive side surface extending from the conductive facing surface to the metal base, and
    the conductive member is provided so that the conductive side surface faces the positive electrode interconnection and the negative electrode interconnection.

4. The vehicular electric compressor according to claim 2, wherein the conductive member is formed integrally with the metal base.

5. The vehicular electric compressor according to claim 2, wherein the conductive member is provided on the metal base with an insulating member interposed therebetween.

6. The vehicular electric compressor according to claim 1, wherein the conductive side surface of the conductive member is formed so as to surround at least a part of a circumference of each of the positive electrode interconnection and the negative electrode interconnection.

7. The vehicular electric compressor according to claim 1, further comprising a metal base configured to support the circuit board,
    wherein the conductive member is formed on the circuit board so as to project toward the metal base.

8. The vehicular electric compressor according to claim 1, wherein
    the driving circuit includes a plurality of the capacitors,
    the plurality of the capacitors are connected in parallel with each other via the positive electrode interconnection, the negative electrode interconnection and the circuit board, and
    the conductive member is configured to come into contact with the positive electrode interconnection and the negative electrode interconnection, which are connected to at least one of the plurality of the capacitors, when the positive electrode interconnection and the negative electrode interconnection are moved upon the application of the external force.

* * * * *